United States Patent
Tai et al.

(10) Patent No.: US 7,215,151 B2
(45) Date of Patent: May 8, 2007

(54) MULTI-STAGE LIGHT EMITTING DIODE DRIVER CIRCUIT

(75) Inventors: Wai Keat Tai, Singapore (SG); Kok-Soon Yeo, Singapore (SG); Chee-Keong Teo, Singapore (SG); John J. De Leon Asuncion, Singapore (SG); Lian-Chun Xu, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 109 days.

(21) Appl. No.: 11/186,753

(22) Filed: Jul. 22, 2005

(65) Prior Publication Data

US 2007/0018685 A1    Jan. 25, 2007

(51) Int. Cl.
*H03K 19/094*    (2006.01)
*G09G 3/32*    (2006.01)
(52) U.S. Cl. ............................. 326/83; 326/87; 326/27; 345/82
(58) Field of Classification Search ................. 326/83, 326/86, 87, 26, 27
See application file for complete search history.

(56) References Cited

U.S. PATENT DOCUMENTS

| 6,285,573 | B1 | 9/2001 | Park |
| 6,803,801 | B2 | 10/2004 | Randazzo et al. |
| 2004/0252565 | A1 | 12/2004 | Yamazaki et al. |
| 2005/0093802 | A1 | 5/2005 | Yamazaki et al. |

OTHER PUBLICATIONS

Razavi, Behzad, "Design of Analog CMOS Integrated Circuits", McGraw Hill, 2001, no month.

*Primary Examiner*—James H. Cho

(57) ABSTRACT

A multi-stage light emitting diode (LED) driver circuit is provided. The circuit includes a driver transistor coupled to an LED. The LED is coupled at a drain of the driver transistor and the driver transistor drives current to the LED. A first transistor stack is coupled between a gate of the driver transistor and ground. A first inverter stage is coupled to a common gate of the first transistor stack. The first inverter stage is further coupled between a high voltage source and ground. A second inverter stage is coupled to a common gate of the first inverter stage. The second inverter stage is further coupled between the high voltage source and ground. The circuit further includes a first transistor coupled between the high voltage source and gate of the driver transistor. The gate of the transistor is coupled to the first inverter stage.

20 Claims, 2 Drawing Sheets

MULTI-STAGE LIGHT EMITTING DIODE DRIVER CIRCUIT

TECHNICAL FIELD

The technical field relates to protection of transistors from current and voltage stress.

BACKGROUND

Transistors used in electronic circuits are constantly subjected to current and voltage stress. For example, transistors coupled to a high voltage source may experience current and voltage stress when being switched from a low voltage source (VccL) to the high voltage source (VccH).

When subjected to swings in voltage, a transistor may experience breakdown across the transistor's junctions. For example, PMOS (P-type metal oxide semiconductor) and NMOS (N-type metal oxide semiconductor) transistors, that include a thin silicon oxide layer separating the gate from the channel, may experience breakdown at the oxide layer due to extreme voltage or current stress caused by input voltage swings. If the voltage at the junction exceeds the breakdown voltage of the PMOS or NMOS transistor, the transistor will eventually fail.

SUMMARY

A multi-stage light emitting diode (LED) driver circuit is provided. The circuit includes a driver transistor coupled to an LED. The LED is coupled at a drain of the driver transistor and the driver transistor drives current to the LED. A first transistor stack is coupled between a gate of the driver transistor and ground. A first inverter stage is coupled to a common gate of the first transistor stack. The first inverter stage is further coupled between a high voltage source and ground. A second inverter stage is coupled to a common gate of the first inverter stage. The second inverter stage is further coupled between the high voltage source and ground. The circuit further includes a first transistor coupled between the high voltage source and gate of the driver transistor. The gate of the transistor is coupled to the first inverter stage.

DETAILED DESCRIPTION

Figure 1:
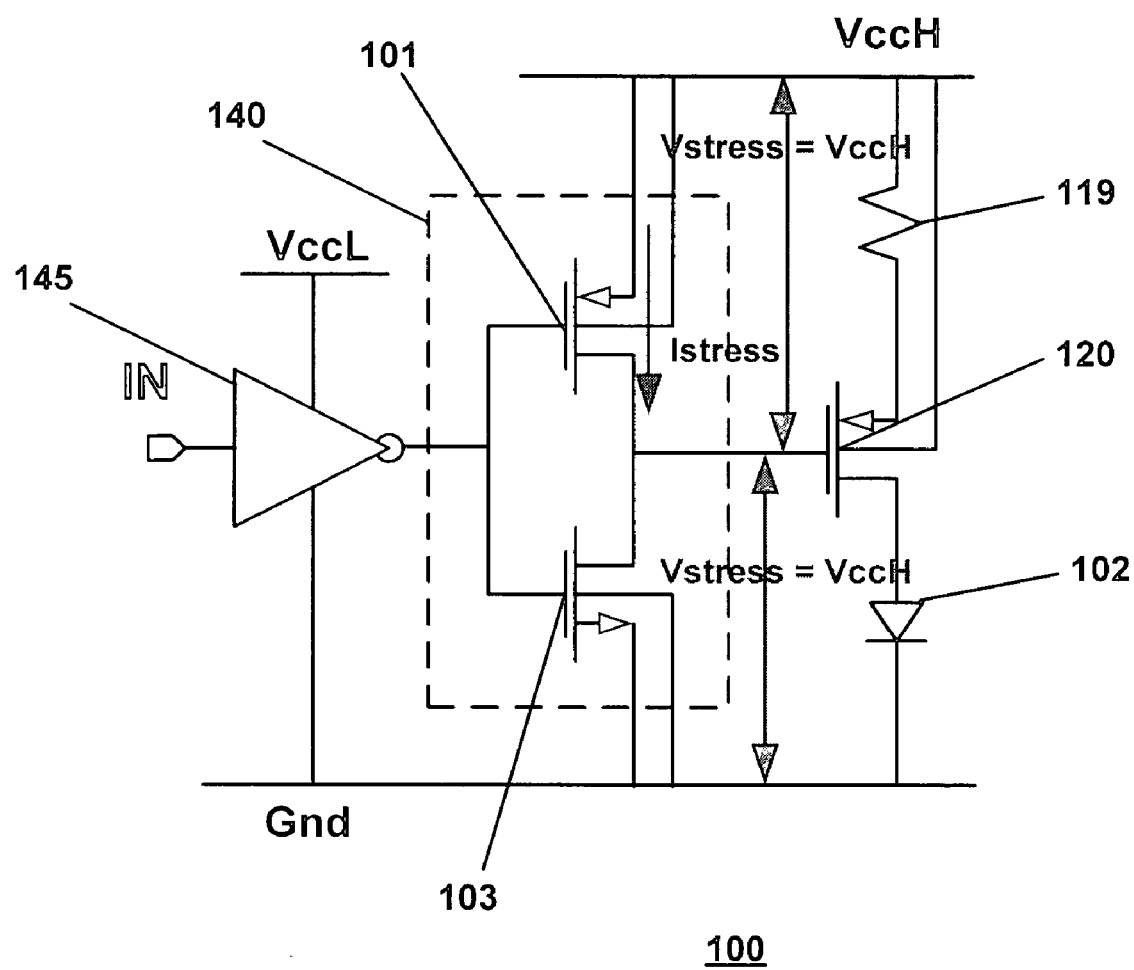
FIG. 1 illustrates a light emitting diode (LED) driver circuit.

FIG. 1 is diagrammatic representation of a light emitting diode (LED) driver circuit 100. The LED driver circuit is used to turn LED 102 from an "on" state to an "off" state, and vice versa. The LED driver circuit 100 may be used in any device that uses an LED, such as a cell phone, personal digital assistant (PDA), a television or other display and/or any other electronic device or circuitry.

As shown in FIG. 1, LED driver circuit 100 includes LED 102 coupled between a PMOS driver transistor 120 drain and ground (Gnd). The PMOS driver 120 source is coupled to a high voltage source (VccH) via a resistor 119. Transistor pair 140 is coupled to the PMOS driver transistor 120 gate, and to inverter 145. Transistor pair 140 is coupled between VccH and Gnd. Inverter 145, coupled between a low voltage source (VccL) and Gnd receives an input signal (IN).

Transistor pair 140 includes a PMOS transistor 101 coupled to VccH and the PMOS driver transistor 120 gate. Transistor pair 140 also includes NMOS transistor 103 coupled to the PMOS driver transistor 120 gate. The NMOS transistor 103 is coupled to Gnd at the NMOS transistor 103 source, and to the drain of the PMOS transistor 101 at the NMOS transistor 103 drain. As shown, the PMOS transistor 101 gate and NMOS transistor 103 gate are coupled to inverter 145.

The PMOS transistor 101 and NMOS transistor 103 are subjected to current and voltage stress when the LED 102 is switched "on" and "off." For example, when PMOS driver transistor 120 is on (driving current to LED 102), the LED 102 is turned on. The gate of PMOS driver transistor 120 is driven to logic low. When the gate of PMOS driver transistor 120 is driven to logic low, the PMOS transistor 101 drain-source junction will be subjected to high voltage stress VccH (Vstress=VccH). If VccH, across the PMOS transistor 101 drain-source junction, is greater than the PMOS transistor 101 drain-source junction breakdown voltage (P+/Nwell breakdown voltage), then PMOS transistor 101 may suffer damage, and eventually may fail.

When PMOS driver transistor 120 is off, the driver PMOS 120 gate is set to high (i.e., VccH). The voltage stress across the NMOS transistor 103 drain-source is VccH (Vstress=VccH), since NMOS transistor 103 is tied to Gnd. If VccH, across the NMOS transistor 103 drain-source junction, is greater than the NMOS transistor 103 drain-source junction breakdown voltage (P+/Nwell breakdown voltage), then NMOS transistor 103 may suffer damage, and eventually may fail. NMOS transistor 103 is subject to a high failure rate because driver PMOS 120 normally will be in the off state (i.e., not driving current to LED 102).

Additionally, the NMOS transistor 103 may experience current stress because of leakage current flowing from the PMOS transistor 101 that may not fully turn off when the LED 102 is off. The PMOS transistor 101 may not fully turn off if the voltage difference between VccH and VccL is greater than threshold voltage (Vth) of PMOS transistor 101 (i.e., VccH−VccL>Vth). If PMOS transistor 101 does not fully turn off, the PMOS transistor 101 will allow some current (Istress) to pass to NMOS transistor 103. Consequently, the average current flowing through NMOS 103, when PMOS driver transistor 120 switches between on and off, is increased, resulting in heating of NMOS transistor 103. Eventually, the increased current stress may lead to early NMOS transistor 103 failure.

Figure 2:
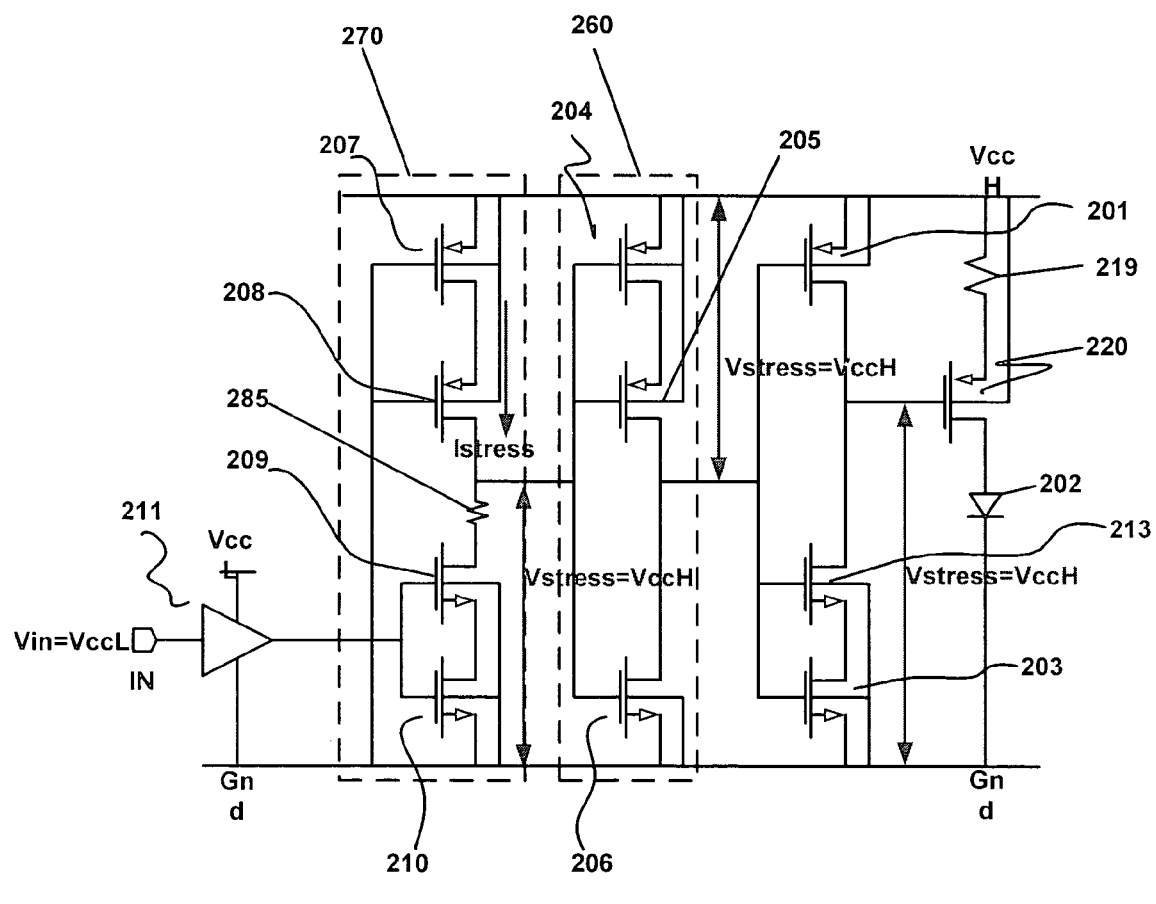
FIG. 2 illustrates an LED driver circuit including a multi-stage input circuit.

FIG. 2 shows an embodiment of a multi-stage LED driver circuit 200. Multi-stage LED driver circuit 200 may reduce current and voltage stress in constituent transistors used to turn LED 202 on and off. The multi-stage LED driver circuit 200, as described herein, may be used in any device that uses an LED, such as a cell phone, a PDA, a television or other display and/or any other electronic device or circuitry.

As shown in FIG. 2, the multi-stage circuit 200 includes LED 202 coupled between a PMOS driver transistor 220 drain and Gnd. The PMOS driver 220 source is coupled to high voltage source VccH via a resistor 219. A PMOS transistor 201 is coupled to VccH at the PMOS transistor 201 source. The PMOS transistor 201 drain is coupled to the PMOS driver transistor 220 gate. The PMOS transistor 201 drain is coupled to a NMOS transistor 213 drain. The NMOS transistor 213 source is coupled to a NMOS transistor 203 drain. The NMOS transistor 203 source is coupled to Gnd.

The PMOS transistor 201 gate is coupled to the NMOS transistors 213, 203 gates and to a first stage inverter circuit 260. The first stage inverter circuit 260 is coupled to a second stage inverter circuit 270. The second stage inverter circuit 270 is further coupled to inverter 211. The inverter 211 is coupled between low voltage source VccL and Gnd, and receives an input signal IN.

The multi-stage LED driver circuit 200 shifts the voltage and/or current stress away from components such as PMOS transistor 201 and NMOS transistor 203 to other components, such as NMOS transistor 213, the first stage inverter 260 and/or the second stage inverter 270. Moreover, voltage stress (Vstress) and/or current stress (Istress) is distributed throughout the circuit 200 to prevent breakdown voltages of the transistors, such as PMOS transistor 201 and NMOS transistors 213, 203, from being reached.

The first stage inverter circuit 260 includes a first PMOS transistor 204 and a second PMOS transistor 205. The first PMOS transistor 204 source is coupled to VccH, and the first PMOS transistor 204 drain is coupled to a second PMOS transistor 205 source. The second PMOS transistor 205 drain is coupled to a NMOS transistor 206 drain. The NMOS transistor 206 source is coupled to Gnd. The first PMOS transistor 205 drain and the NMOS transistor 206 drain are coupled to the commonly coupled PMOS transistor 201 gate and NMOS transistors 213, 203 gates. The PMOS transistors 204, 205 gates and NMOS transistor 206 gate are commonly coupled to a second stage inverter circuit 270.

The second stage inverter circuit 270 includes a first PMOS transistor 207 and a second PMOS transistor 208. The first PMOS transistor 207 source is coupled to VccH, and the first PMOS transistor 207 drain is coupled to the second PMOS transistor 208 source. The second PMOS transistor 208 drain is coupled, via a resistor 285, to a first NMOS transistor 209 drain. The PMOS transistor 208 drain is coupled to the commonly coupled PMOS transistors 204, 205 gates and NMOS transistor 206 gate, of the first stage inverter circuit 260. The first NMOS transistor 209 source is coupled to a second NMOS transistor 210 drain. The second NMOS transistor 210 source is coupled to Gnd. The PMOS transistors 207, 208 gates and NMOS transistors 209, 210 gates are commonly coupled to inverter 211 and to Gnd. The Inverter 211 is coupled to low voltage source VccL and Gnd, and receives an input signal IN (e.g., Vin=VccL).

When PMOS driver transistor 220 is off (i.e., LED 202 is off), the driver PMOS 220 gate is at VccH. The voltage across the NMOS transistors 213 and 203 will be VccH since NMOS transistor 203 is tied to Gnd. In this case, the voltage stress (Vstress) caused by VccH is distributed across the two NMOS transistors 213 and 203. Since the voltage stress is distributed across two transistors, the voltage stress across a single transistor such as NMOS transistor 203 is reduced. Therefore, the chance that the distributed VccH value will be high enough to cause, for example, NMOS transistors 213 and/or 203 drain-source junction breakdown is reduced. Stacking up transistors by inserting one or more additional transistors, such as NMOS transistor 213, may reduce the risk of damage to the NMOS transistors (e.g., transistors 203, 213) and early failure.

Additionally, to prevent leakage current from flowing through PMOS transistor 201 into NMOS transistors 213 and 203 when PMOS transistor 201 is in the off state, the first stage inverter circuit 260 is inserted, as shown. As described above, assuming VccH−VccL>Vth (Vth being threshold voltage of transistor 201), transistor 201 will not turn completely off unless the transistor 201 gate voltage is raised to a higher voltage, for example, from VccL to VccH. To raise the gate voltage of PMOS transistor 201, the first stage inverter circuit 260 output is coupled to the PMOS 201 gate, as shown. The inverter circuit 260 includes PMOS transistors 204, 205 as well as NMOS transistor 206. When PMOS transistors 204, 205 are on, the PMOS transistor 205 source will provide a raised voltage (VccH) to the PMOS 201 gate. The raised voltage VccH will completely turn PMOS transistor 201 off, preventing leakage current from entering into the NMOS transistors 213, 203.

Inserting the first stage inverter 260 inverts the logic of circuit 200. To prevent this inversion and maintain logic consistency, a second stage inverter circuit 270 is coupled to the first stage circuit 260. It is recognized that additional inverter stages may be inserted in circuit 200. The addition of the second stage inverter 270 further distributes the current and/or voltage stress to certain components, such as NMOS transistors 209, 210, of the second stage inverter 270 (described below in more detail). However, a resistor 285 is inserted in series with the NMOS transistor 209 to increase the drain source resistance (Rds) of PMOS transistors 207, 208. The resistor 285 limits the pulse current through the path of second stage inverter circuit 270. By increasing the drain source resistance, the pulse current through NMOS transistors 209, 210, when driver PMOS 220 switches on and off, is reduced. The value of resistor 285 may range from few Ohms (e.g., 1 to 100 Ohms) to few hundreds of Ohms (e.g., 100 to 900 Ohms). Although a higher resistor value for resistor 285 will reduce the pulse current, however, the rise/fall time of the output logic of the circuit 200 may be slowed as a result.

The first and second stage inverter circuits 260 and 270 help to reduce the voltage stress across PMOS transistor 201 and NMOS transistors 213, 203 when the LED 202 is in the off state. As described above, to turn LED 202 off, the PMOS transistor 220 gate voltage is pulled to the high voltage source VccH. In this case, Vstress=VccH is distributed between NMOS transistor 213 and NMOS transistor 203. Moreover, the PMOS transistor 201 gate voltage and NMOS transistors 213, 203 gate voltage is low (Gnd). In other words, the first stage inverter circuit 260 output voltage of is low (Gnd). Since the first stage inverter circuit 260 output voltage is low (Gnd), both PMOS transistors 204 and 205 will share the Vstress=VccH. Thus, the voltage stress is distributed to the components of the first stage inverter circuit 260, such as the PMOS transistors 204 and 205.

When the first stage inverter circuit 260 output is low, this means that the first stage inverter circuit 260 input, or the second stage inverter circuit 270 output, is at the high voltage source VccH. If the second stage inverter circuit 270 output is at VccH, then Vstress=VccH is distributed between the resistor 285 and NMOS transistors 209, 210. Again, voltage stress is distributed among a plurality of components, reducing the chance of transistor damage.

As described above, the voltage and/or current stress experienced by, for example, PMOS transistor 201 and NMOS transistor 203 is reduced. For example, the voltage and/or current stress is distributed throughout the components, such as PMOS transistors 204, 205, 207, 208, NMOS transistors 213, 203, 209 and 210, and resistor 285. The reduction in voltage and/or current stress prevents transistor breakdown and may extend transistor life.

What is claimed is:

1. A multi-stage light emitting diode (LED) driver circuit, comprising:

a driver transistor coupled to an LED, wherein the LED is coupled at a drain of the driver transistor and the driver transistor drives current to the LED;

a first transistor stack coupled between a gate of the driver transistor and ground;

a first inverter stage coupled to a common gate of the first transistor stack, wherein the first inverter stage is coupled between a high voltage source and ground;

a second inverter stage coupled to a common gate of the first inverter stage, wherein the second inverter stage is coupled between the high voltage source and ground; and a first transistor coupled between the high voltage source and the gate of the driver transistor, wherein the gate of the first transistor is coupled to the first inverter stage.

2. The circuit of claim 1, wherein the first transistor stack comprises:

a pair of NMOS transistors connected in series, and wherein a drain of a first NMOS transistor in the pair is coupled to the gate of the driver transistor and a source of a second NMOS transistor in the pair is coupled to ground.

3. The circuit of claim 1, wherein the driver transistor and the first transistor are PMOS transistors.

4. The circuit of claim 1, wherein the first inverter stage comprises:

a first pair of PMOS transistors connected in series; and an NMOS transistor, and wherein the first pair of PMOS transistors are coupled between the high voltage source and the NMOS transistor, the NMOS transistor is coupled to ground at a source of the NMOS transistor, and gates of the first pair of PMOS transistors and the NMOS transistor are commonly coupled to the second inverter stage.

5. The circuit of claim 4, wherein the second inverter stage comprises:

a second pair of PMOS transistors connected in series;
a first NMOS transistor stack, wherein the first NMOS transistor stack comprises a pair of NMOS transistors connected in series; and a resistor, wherein the second pair of PMOS transistors are coupled between the high voltage source and the resistor, the first NMOS transistor stack is coupled between the resistor and ground, the drain of one PMOS transistor in the second pair of PMOS transistors is coupled to the commonly coupled gates of the first inverter stage, and gates of the second pair of PMOS transistors and the first NMOS transistor stack are commonly coupled to an inverter.

6. A light emitting diode (LED) driver circuit, comprising:
a first inverter stage to output a first voltage;
a second inverter stage to output a second voltage;
a first transistor stack including a first pair of NMOS transistors connected in series;
a PMOS transistor coupled at a drain of the PMOS transistor to one NMOS transistor of the first transistor stack, wherein gates of the first pair of NMOS transistors of the first transistor stack and gates of PMOS transistor are commonly coupled to receive the first output voltage from the first inverter stage;
a driver transistor coupled at a gate of the driver transistor to the drain of the PMOS transistor and a drain of the one NMOS transistor of the first transistor stack; and
an LED coupled between a drain of the driver transistor and ground, wherein if the LED is off, a gate voltage of the driver transistor is high, the first output voltage is low and the second output voltage is high.

7. The circuit of claim 6, wherein if the LED is on, the gate voltage of the driver transistor is low, the first output voltage is high and the second output voltage is low.

8. The circuit of claim 6, wherein the driver transistor is a PMOS transistor.

9. The circuit of claim 6, wherein the first inverter stage comprises:

a first pair of PMOS transistors connected in series; and
an NMOS transistor, and wherein the first pair of PMOS transistors are coupled between a high voltage source and the NMOS transistor, the NMOS transistor is coupled to ground at a source of the NMOS transistor, and gates of the first pair of PMOS transistors and the gate of NMOS transistor are commonly coupled to the second inverter stage.

10. The circuit of claim 6, wherein the second inverter stage comprises:

a second pair of PMOS transistors connected in series;
a second transistor stack, and wherein the second stack comprises second pair of NMOS transistors connected in series; and a resistor, and wherein the second pair of PMOS transistors are coupled between the high voltage source and the resistor, the second NMOS transistor stack is coupled between the resistor and ground, and the drain of one PMOS transistor in the second PMOS pair is coupled to the commonly coupled gates of the first inverter stage.

11. The circuit of claim 10, further comprising:
an inverter, wherein gates of the second pair of PMOS transistors and gates of the second NMOS transistor stack are commonly coupled to the inverter.

12. A light emitting diode driver circuit, comprising:
a light emitting diode (LED);
a PMOS driver transistor coupled to the LED, wherein the LED is coupled at a drain of the PMOS driver transistor and the driver transistor drives current to the LED;
a first transistor stack coupled between a gate of the driver transistor and ground, wherein the first transistor stack including a pair of NMOS transistors connected in series; and
a first PMOS transistor coupled between a high voltage source and the gate of the PMOS driver transistor, wherein the gate of the PMOS driver transistor is at the high voltage source and the first transistor stack distributes voltage stress across the pair of NMOS transistors if the PMOS driver transistor is not driving current to the LED.

13. The circuit of claim 12, wherein the gate of the PMOS driver transistor is at a ground voltage if the driver transistor is driving current to the LED and the LED is on.

14. The circuit of claim 12, further comprising:
a first inverter stage coupled to a common gate of the first transistor stack, wherein the first inverter stage is coupled between the high voltage source and ground.

15. The circuit of claim 14, wherein the first inverter stage comprises:

a first pair of PMOS transistors connected in series; and
an NMOS transistor, and wherein the pair of PMOS transistors are coupled between the high voltage source and the NMOS transistor, the NMOS transistor is coupled to ground at a source of the NMOS transistor, and gates of the first pair of PMOS transistors and gates of the NMOS transistor are commonly coupled to a second inverter stage.

16. The circuit of claim 14, further comprising:
a second inverter stage coupled to a common gate of the first inverter stage, and wherein the second inverter stage is coupled between the high voltage source and ground.

17. The circuit of claim 16, wherein an output voltage of the second inverter stage is at a ground voltage if the PMOS driver transistor is not driving current to the LED.

18. The circuit of claim 16, wherein an output voltage of the second inverter stage is at the high voltage source if the PMOS driver transistor is driving current to the LED.

19. The circuit of claim 16, wherein the second inverter stage comprising:
   a second pair of PMOS transistors connected in series;
   a second NMOS transistor stack, wherein the second NMOS transistor stack comprises a second pair of NMOS transistors connected in series; and
   a resistor, wherein the second pair of PMOS transistors are coupled between the high voltage source and the resistor, the second NMOS transistor stack is coupled between the resistor and ground, a drain of one PMOS transistor in the second pair of PMOS transistors is coupled to the commonly coupled gates of the first inverter, and gates of the second pair of PMOS transistors and gates of the second NMOS transistor stack are commonly coupled to an inverter.

20. The circuit of claim 12, wherein a gate voltage of the PMOS driver transistor is at the high voltage source and a gate voltage of the first PMOS transistor is at a ground voltage if the driver circuit is not driving current to the LED.

* * * * *